(12) United States Patent
Cheng et al.

(10) Patent No.: US 6,737,670 B2
(45) Date of Patent: May 18, 2004

(54) SEMICONDUCTOR SUBSTRATE STRUCTURE

(75) Inventors: Zhi-Yuan Cheng, Cambridge, MA (US); Eugene A. Fitzgerald, Windham, NH (US); Dimitri A. Antoniadis, Newton, MA (US); Judy L. Hoyt, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/384,160

(22) Filed: Mar. 7, 2003

(65) Prior Publication Data
US 2003/0168654 A1 Sep. 11, 2003

Related U.S. Application Data

(62) Division of application No. 09/928,126, filed on Aug. 10, 2001, now Pat. No. 6,573,126
(60) Provisional application No. 60/225,666, filed on Aug. 16, 2000.

(51) Int. Cl.$^7$ ............................................. H01L 29/06
(52) U.S. Cl. ......................................................... 257/19
(58) Field of Search ..................... 257/19, 18, E29.193, 257/798; 438/149, 761, 763, 478–479, 483, 506–507, 522, 530

(56) References Cited

U.S. PATENT DOCUMENTS

| | | |
|---|---|---|
| 4,010,045 A | 3/1977 | Ruehrwein |
| 4,710,788 A | 12/1987 | Dämbkes et al. |
| 4,990,979 A | 2/1991 | Otto |
| 4,997,776 A | 3/1991 | Harame et al. |
| 5,013,681 A | 5/1991 | Godbey et al. |
| 5,155,571 A | 10/1992 | Wang et al. |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,221,413 A | 6/1993 | Brasen et al. |
| 5,241,197 A | 8/1993 | Murakami et al. |
| 5,250,445 A | 10/1993 | Bean et al. |
| 5,285,086 A | 2/1994 | Fitzgerald |
| 5,291,439 A | 3/1994 | Kauffmann et al. |
| 5,298,452 A | 3/1994 | Meyerson |
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel |
| 5,399,522 A | 3/1995 | Ohori |
| 5,413,679 A | 5/1995 | Godbey |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,596,527 A | 1/1997 | Tomioka et al. |
| 5,617,351 A | 4/1997 | Bertin et al. |
| 5,630,905 A | 5/1997 | Lynch et al. |
| 5,659,187 A | 8/1997 | Legoues et al. |
| 5,683,934 A | 11/1997 | Candelaria |
| 5,698,869 A | 12/1997 | Yoshimi et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |

(List continued on next page.)

FOREIGN PATENT DOCUMENTS

| | | |
|---|---|---|
| DE | 41 01 167 | 7/1992 |
| EP | 0 514 018 | 11/1992 |
| EP | 0 587 520 | 3/1994 |

(List continued on next page.)

OTHER PUBLICATIONS

IBM Technical Disclosure Bulletin, vol. 32, No. 8A, Jan. 1990, "Optimal Growth Technique and Structure for Strain Relaxation of Si–Ge Layers on Si Substrates," pgs. 330–331.

(List continued on next page.)

Primary Examiner—Craig A. Thompson
(74) Attorney, Agent, or Firm—Testa Hurwitz & Thibeault LLP

(57) ABSTRACT

A process for producing monocrystalline semiconductor layers. In an exemplary embodiment, a graded $Si_{1-x}Ge_x$ (x increases from 0 to y) is deposited on a first silicon substrate, followed by deposition of a relaxed $Si_{1-y}Ge_y$ layer, a thin strained $Si_{1-z}Ge_z$ layer and another relaxed $Si_{1-y}Ge_y$ layer. Hydrogen ions are then introduced into the strained $Si_zGe_z$ layer. The relaxed $Si_{1-y}Ge_y$ layer is bonded to a second oxidized substrate. An annealing treatment splits the bonded pair at the strained Si layer, such that the second relaxed $Si_{1-y}Ge_y$ layer remains on the second substrate. In another exemplary embodiment, a graded $Si_{1-x}Ge_x$ is deposited on a first silicon substrate, where the Ge concentration x is increased from 0 to 1. Then a relaxed GaAs layer is deposited on the relaxed Ge buffer. As the lattice constant of GaAs is close to that of Ge, GaAs has high quality with limited dislocation defects. Hydrogen ions are introduced into the relaxed GaAs layer at the selected depth. The relaxed GaAs layer is bonded to a second oxidized substrate. An annealing treatment splits the bonded pair at the hydrogen ion rich layer, such that the upper portion of relaxed GaAs layer remains on the second substrate.

53 Claims, 8 Drawing Sheets

U.S. PATENT DOCUMENTS

| | | |
|---|---|---|
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,847,419 A | 12/1998 | Imai et al. |
| 5,877,070 A | 3/1999 | Goesele et al. |
| 5,891,769 A | 4/1999 | Hong et al. |
| 5,906,708 A | 5/1999 | Robinson et al. |
| 5,906,951 A * | 5/1999 | Chu et al. .................. 438/751 |
| 5,912,479 A | 6/1999 | Mori et al. |
| 5,943,560 A | 8/1999 | Chang et al. |
| 5,963,817 A | 10/1999 | Chu et al. |
| 5,966,622 A | 10/1999 | Levine et al. |
| 5,998,807 A | 12/1999 | Lustig et al. |
| 6,013,134 A | 1/2000 | Chu et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,184,111 B1 | 2/2001 | Henley et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,218,677 B1 | 4/2001 | Broekaert |
| 6,232,138 B1 | 5/2001 | Fitzgerald et al. |
| 6,235,567 B1 | 5/2001 | Huang |
| 6,242,324 B1 | 6/2001 | Kub et al. |
| 6,249,022 B1 | 6/2001 | Lin et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,291,321 B1 | 9/2001 | Fitzgerald |
| 6,313,016 B1 | 11/2001 | Kibbel et al. |
| 6,316,301 B1 | 11/2001 | Kant |
| 6,323,108 B1 | 11/2001 | Kub et al. |
| 6,329,063 B2 | 12/2001 | Lo et al. |
| 6,335,546 B1 | 1/2002 | Tsuda et al. |
| 6,339,232 B1 | 1/2002 | Takagi |
| 6,350,993 B1 | 2/2002 | Chu et al. |
| 6,368,733 B1 | 4/2002 | Nishinaga |
| 6,372,356 B1 | 4/2002 | Thornton et al. |
| 6,399,970 B2 | 6/2002 | Kubo et al. |
| 6,403,975 B1 | 6/2002 | Brunner et al. |
| 6,407,406 B1 | 6/2002 | Tezuka |
| 6,420,937 B1 | 7/2002 | Akatsuka et al. |
| 6,425,951 B1 | 7/2002 | Chu et al. |
| 6,429,061 B1 | 8/2002 | Rim |
| 6,521,041 B2 | 2/2003 | Wu et al. |
| 6,555,839 B2 | 4/2003 | Fitzgerald et al. |
| 2001/0003364 A1 | 6/2001 | Sugawara et al. |
| 2002/0043660 A1 | 4/2002 | Yamazaki et al. |
| 2002/0052084 A1 | 5/2002 | Fitzgerald |
| 2002/0068393 A1 | 6/2002 | Fitzgerald et al. |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0168864 A1 | 11/2002 | Cheng et al. |
| 2003/0003679 A1 | 1/2003 | Doyle et al. |
| 2003/0013323 A1 | 1/2003 | Hammond et al. |
| 2003/0025131 A1 | 2/2003 | Lee et al. |
| 2003/0057439 A1 | 3/2003 | Fitzgerald |

FOREIGN PATENT DOCUMENTS

| | | |
|---|---|---|
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| GB | 2 342 777 | 4/2000 |
| JP | 4-307974 | 10/1992 |
| JP | 5-166724 | 7/1993 |
| JP | 7-094420 | 4/1994 |
| JP | 6-177046 | 6/1994 |
| JP | 7-106446 | 4/1995 |
| JP | 7-240372 | 9/1995 |
| JP | 10-270685 | 10/1998 |
| JP | 11-233744 | 8/1999 |
| JP | 2000-31491 | 1/2000 |
| JP | 2000-021783 | 1/2000 |
| JP | 2001319935 | 5/2000 |
| JP | 2002-076334 | 3/2002 |
| JP | 2002-164520 | 6/2002 |
| JP | 2002-289533 | 10/2002 |
| WO | WO 98/59365 | 12/1998 |
| WO | WO 99/53539 | 10/1999 |
| WO | WO 00/48239 | 8/2000 |
| WO | WO 00/54338 | 9/2000 |
| WO | WO 01/022482 | 3/2001 |
| WO | WO 01/54202 | 7/2001 |
| WO | WO 01/93338 | 12/2001 |
| WO | WO 01/99169 A2 | 12/2001 |
| WO | WO 02/13262 | 2/2002 |
| WO | WO 02/15244 A2 | 2/2002 |
| WO | WO 02/27783 A1 | 4/2002 |
| WO | WO 02/47168 | 6/2002 |
| WO | WO 02/071488 | 9/2002 |
| WO | WO 02/071491 | 9/2002 |
| WO | WO 02/071495 A1 | 9/2002 |
| WO | WO 02/082514 A1 | 10/2002 |

OTHER PUBLICATIONS

Maszara, "Silicon–On–Insulator by Wafer Bonding: A Review," *Journal of the Electrochemical Society,* No. 1 (Jan. 1991) pp. 341–347.

Chang et al., "Selective Etching of SiGe/Si Heterostructures," *Journal of the Electrochemical Society,* No. 1 (Jan. 1991) pp. 202–204.

Fitzgerald et al., "Totally Relaxed $Ge_xSi_{1-x}$ Layers with Low Threading Dislocation Densities Grown on Si Substrates," *Applied Physics Letters,* vol. 59, No. 7 (Aug. 12, 1991) pp. 811–813.

Fitzgerald et al., "Related $Ge_xSi_{1-x}$ structures for III–V integration with Si and high mobility two–dimensional electron gases in Si," AT&T Bell Laboratories, Murray Hill, NJ 07974 (1992) *American Vacuum Society,* pp. 1807–1819.

Feijoo et al., "Epitaxial Si–Ge Etch Stop Layers with Ethylene Diamine Pyrocatechol for Bonded and Etchback Silicon–on–Insulator," *Journal of Electronic Materials,* vol. 23, No. 6 (Jun. 1994) pp. 493–496.

Ismail, "Si/SiGe High–Speed Field–Effect Transistors," *Electron Devices Meeting, Washington, D.C.* (Dec. 10, 1995) pp. 20.1.1–20.1.4.

Sadek et al., "Design of Si/SiGe Heterojunction Complementary Metal–Oxide–Semiconductor Transistors," *IEEE Trans. Electron Devices* (Aug. 1996) pp. 1224–1232.

Usami et al., "Spectroscopic study of Si–based quantum wells with neighboring confinement structure," *Semicon. Sci. Technol.* (1997) (astract).

König et al., "Design Rules for N–Type SiGe Hetero FETs," *Solid State Electronics,* vol. 41, No. 10 (1997), pp. 1541–1547.

Maiti et al., "Strained–Si heterostructure field effect transistors," *Semicond. Sci. Technol.,* vol. 13 (1998) pp. 1225–1246.

Borenstein et al., "A New Ultra–Hard Etch–Stop layer for High Precision Micromachining," *Proceedings of the 1999 12$^{th}$ IEEE International Conference on Micro Electro Mechanical Systems (MEMs)* (Jan. 17–21, 1999) pp. 205–210.

Ishikawa et al., "SiGe–on–insulator substrate using SiGe alloy grown Si(001)," *Applied Physics Letters,* vol. 75, No. 7 (Aug. 16, 1999) pp. 983–985.

Mizuno et al., "Electron and Hold Mobility Enhancement in Strained–Si MOSFET's on SiGe–on–Insulator Substrates Fabricated by SIMOX Technology," *IEEE Electron Device Letters,* vol. 21, No. 5 (May 2000) pp. 230–232.

Yeo et al., "Nanoscale Ultra–Thin–Body Silicon–on–Insulator P–MOSFET with a SiGe/Si Heterostructure Channel," *IEEE Electron Device Letters,* vol. 21, No. 4 (Apr. 2000) pp. 161–163.

Hackbarth et al., "Alternatives to thick MBE–grown relaxed SiGe buffers," *Thin Solid Films,* vol. 369, No. 1–2 (Jul. 2000) pp. 148–151.

Barradas et al., "RBS analysis of MBE–grown SiGe/(001) Si heterostructures with thin, high Ge content SiGe channels for HMOS transistors," *Modern Physics Letters B* (2001) (abstract).

Zhang et al., "Demonstration of a GaAs–Based Compliant Substrate Using Wafer Bonding and Substrate Removal Techniques," Electronic Materials and Processing Research Laboratory, Department of Electrical Engineering, University Park, PA 16802 (1998) pp. 25–28.

Bruel, "Silicon on Insulator Material Technology," *Electronic Letters,* vol. 13, No. 14 (Jul. 6, 1995) pp. 1201–1202.

Bruel et al., "®Smart Cut: A Promising New SOI Material Technology," *Proceedings 1995 IEEE International SOI Conference* (Oct. 1995) pp. 178–179.

Ishikawa et al., "Creation of Si–Ge–based SIMOX structures by low energy oxygen implantation," *Proceedings 1997 IEEE International SOI Conference* (Oct. 1997) pp. 16–17.

Huang et al., "High–quality strain–relaxed SiGe alloy grown on implanted silicon–on–insulator substrate," *Applied Physics Letters,* vol. 76, No. 19 (May 8, 2000) pp. 2680–2682.

Armstrong et al., "Design of Si/SiGe Heterojunction Complementary Metal–Oxide–Semiconductor Transistors," *IEDM Technical Digest* (1995) pp. 761–764.

Armstrong, "Technology for SiGe Heterostructure–Based CMOS Devices", Ph.D Thesis, Massachusetts Institute of Technology (1999) pp. 1–154.

Augusto et al., "Proposal for a New Process Flow for the Fabrication of Silicon–Based Complementary MOD–MOSFETs without Ion Implantation," *Thin Solid Films,* vol. 294, No. 1–2 (1997) pp. 254–258.

Bouillon et al., "Search for the optimal channel architecture for 0.18/0.12 $\mu$m bulk CMOS Experimental study," *IEEE* (1996) pp. 21.2.1–21.2.4.

Bufler et al., "Hole transport in strained $Si_{1-x}Ge_x$ alloys on Si1–yGey substrates," *Journal of Applied Physics,* vol. 84, No. 10 (Nov. 15, 1998) pp. 5597–5602.

Burghartz et al., "Microwave Inductors and Capacitors in Standard Multilevel Interconnect Silicon Technology", *IEEE Transactions on Microwave Theory and Techniques,* vol. 44, No. 1 (Jan. 1996) pp. 100–104.

Canaperi et al., "Preparation of a relaxed Si–Ge layer on an insulator in fabricating high–speed semiconductor devices with strained expitaxial films," International Business Machines Corporation, USA (2002) (abstract).

Carlin et al., "High Efficiency GaAs–on–Si Solar Cells with High Voc Using Graded GeSi Buffers," *IEEE* (2000) pp. 1006–1011.

Cheng et al., "Electron Mobility Enhancement in Strained–Si n–MOSFETs Fabricated on SiGe–on–Insulator (SGOI) Substrates," *IEEE Electron Device Letters,* vol. 22, No. 7 (Jul. 2001) pp. 321–323.

Cheng et al., "Relaxed Silicon–Germanium on Insulator Substrate by Layer Transfer," *Journal of Electronic Materials,* vol. 30, No. 12 (2001) pp. L37–L39.

Cullis et al, "Growth ripples upon strained SiGe epitaxial layers on Si and misfit dislocation interactions," *Journal of Vacuum Science and Technology A,* vol. 12, No. 4 (Jul./Aug. 1994) pp. 1924–1931.

Currie et al., "Controlling Threading Dislocation in Ge on Si using Graded SiGe Layers and Chemical–Mechanical Polishing," vol. 72 No. 14 (Apr. 6, 1998) pp. 1718–1720.

Currie et al., "Carrier mobilities and process stability of strained Si n– and p–MOSFETs on SiGe virtual substrates," *J. Vac. Sci. Technol. B.,* vol. 19, No. 6 (Nov./Dec. 2001) pp. 2268–2279.

Eaglesham et al., "Dislocation–Free Stranski–Krastanow Growth of Ge on Si(100)," *Physical Review Letters,* vol. 64, No. 16 (Apr. 16, 1999) pp. 1943–1946.

Fischetti et al., "Band structure, deformation potentials, and carrier mobility in strained Si, Ge, and SiGe alloys," *J. Appl. Phys.,* vol. 80, No. 4 (Aug. 15, 1996) pp. 2234–2252.

Fischetti, "Long–range Coulomb interactions in small Si devices. Part II. Effective electron mobility in thin–oxide structures," *Journal of Applied Physics,* vol. 89, No. 2 (Jan. 15, 2001) pp. 1232–1250.

Fitzgerald et al., "Dislocation dynamics in relaxed graded composition semiconductors," *Materials Science and Engineering B67* (1999) pp. 53–61.

Garone et al., "Silicon vapor phase epitaxial growth catalysis by the presence of germane," *Applied Physics Letters,* vol. 56, No. 13 (Mar. 26, 1990) pp. 1275–1277.

Gray and Meyer, "Phase–Locked Loops", *Analysis and Design of Analog Integrated Circuits* (1984) pp. 605–632.

Grutzmacher et al., "Ge segregation in SiGe/Si heterostructures and its dependence on deposition technique and growth atmosphere," *Applied Physics Letters*, vol. 63, No. 18 (Nov. 1, 1993) pp. 2531–2533.

Hackbarth et al., "Strain relieved SiGe buffers for Si–based heterostructure field–effect transistors," *Journal of Crystal Growth*, vol. 201/202 (1999) pp. 734–738.

Herzog et al., "SiGe–based FETs: buffer issues and device results," *Thin Solid Films*, vol. 380 (2000) pp. 36–41.

Höck et al., "Carrier mobilities in modulation doped $Si_{1-x}Ge_x$ heterostructures with respect to FET applications," *Thin Solid Films*, vol. 336 (1998) pp. 141–144.

Höck et al., "High hole mobility in $Si_{0.17}Ge_{0.83}$ channel metal–oxide–semiconductor field–effect transistors grown by plasma–enhanced chemical vapor deposition," *Applied Physics Letters*, vol. 76, No. 26 (Jun. 26, 2000) pp. 3920–3922.

Höck et al., "High performance 0.25 $\mu$m p–type Ge/SiGe MODFETs," *Electronics Letters*, vol. 34, No. 19 (Sep. 17, 1998) pp. 1888–1889.

Huang et al., "The Impact of Scaling Down to Deep Submicron on CMOS RF Circuits", IEEE Journal of Solid–State Circuits, vol. 33, No. 7, Jul., 1998, pp. 1023–1036.

"2 Bit/Cell EEPROM Cell Using Band to Band Tunneling for Data Read–Out," IBM Technical Disclosure Bulletin, vol. 35, No. 4B (Sep. 1992) pp. 136–140.

Ismail et al., "Modulation–doped n–type Si/SiGe with inverted interface," *Appl. Phys. Lett.*, vol. 65, No. 10 (Sep. 5, 1994) pp. 1248–1250.

Kearney et al., "The effect of alloy scattering on the mobility of holes in a $Si_{1-x}Ge_x$ quantum well," *Semicond. Sci Technol.*, vol. 13 (1998) pp. 174–180.

Kim et al., "A Fully Integrated 1.9–GHz CMOS Low–Noise Amplifier," *IEEE Microwave and Guided Wave Letters*, vol. 8, No. 8 (Aug. 1998) pp. 293–295.

Koester et al., "Extremely High Transconductance $Ge/Si_{0.4}Ge_{0.6}$ p–MODFET's Grown by UHV–CVD," *IEEE Electron Device Letters*, vol. 21, No. 3 (Mar. 2000) pp. 110–112.

König et al., "P–Type Ge–Channel MODFET's with High Transconductance Grown on Si Substrates," *IEEE Electron Device Letters*, vol. 14, No. 4 (Apr. 1993) pp. 205–207.

König et al., "SiGe HBTs and HFETs," *Solid–State Electronics*, vol. 38, No. 9 (1995) pp. 1595–1602.

Kuznetsov et al., "Technology for high–performance n–channel SiGe modulation–doped field–effect transistors," *J. Vac. Sci. Technol., B* 13(6) (Nov./Dec. 1995) pp. 2892–2896.

Larson, "Integrated Circuit Tecnology Options for RFIC's—Present Status and Future Directions", *IEEE Journal of Solid–State Circutis*, vol. 33, No. 3, Mar. 1998, pp. 387–399.

Lee et al., "CMSO RF Integrated Circuits at 5 GHz and Beyond", *Proceedings of the IEEE*, vol. 88, No. 10 (Oct. 2000) pp. 1560–1571.

Lee et al., "Strained Ge channel p–type metal–oxide–semiconductor field–effect transistors grown on $Si_{1-x}Ge_x$/Si virtual substrates," *Applied Physics Letters*, vol. 79, No. 20 (Nov. 12, 2001) pp. 3344–3346.

Lee et al., "Strained Ge channel p–type MOSFETs fabricated on $Si_{1-x}Ge_x$/Si virtual substrates," *Mat. Res. Soc. Symp. Proc.*, vol. 686 (2002) pp. A1.9.1–A1.9.5.

Leitz et al., "Channel Engineering of SiGe–Based Heterostructures for High Mobility MOSFETs," *Mat. Res. Soc. Symp. Proc.*, vol. 686 (2002) pp. A3.10.1–A3.10.6.

Leitz et al., "Dislocation glide and blocking kinetics in compositionally graded SiGe/Si," *Journal of Applied Physics*, vol. 90, No. 6 (Sep. 15, 2001) pp. 2730–2736.

Leitz et al., "Hole mobility enhancements in strained Si/Si-1-yGey p–type metal–oxide–semiconductor field–effect transistors grown on relaxed $Si_{1-x}Ge_x$ (x<y) virtual substrates," *Applied Physics Letters*, vol. 79, No. 25 (Dec. 17, 2001) pp. 4246–4248.

Li et al., "Design of high speed Si/SiGe heterojunction complementary metal–oxide–semiconductor field effect transistors with reduced short–channel effects," *J. Vac. Sci. Technol.*, vol. 20 No. 3 (May/Jun. 2002) pp. 1030–1033.

Lu et al., "High Performance 0.1 $\mu$m Gate–Length P–Type SiGe MODFETs and MOS–MODFET's", *IEEE Transactions on Electron Devices*, vol. 47, No. 8 (Aug. 2000) pp. 1645–1652.

Kummer et al., "Low energy plasma enhanced chemical vapor deposition," *Materials Science and Engineering B89* (2002) pp. 288–295.

Meyerson et al., "Cooperative Growth Phenomena in Silicon/Germanium Low–Temperature Epitaxy," *Applied Physics Letters*, vol. 53, No. 25 (Dec. 19, 1988) pp. 2555–2557.

Mizuno et al., "Advanced SOI–MOSFETs with Strained–Si Channel for High Speed CMOS–Electron/Hole Mobility Enhancement," 2000 Symposium on VLSI Technology, Digest of Technical Papers, Honolulu, (Jun. 13–15), IEEE New York, NY, pp. 210–211.

Mizuno et al., "High Performance Strained–Si p–MOSFETs on SiGe–on–Insulator Substrates Fabricated by SIMOX Technology," *IEEE IDEM Technical Digest* (1999) pp. 934–936.

Nayak et al., "High–Mobility Strained–Si PMOSFET's"; *IEEE Transactions on Electron Devices*, vol. 43, No. 10 (Oct. 1996) pp. 1709–1716.

O'Neill et al., "SiGe Virtual substrate N–channel heterojunction MOSFETS," *Semicond. Sci. Technol.*, vol. 14 (1999) pp. 784–789.

Papananos, "Low Noise Amplifiers in MOS Technologies," and "Low Noise Tuned–LC Oscillator," *Radio–Frequency Microelectronic Circuits for Telecommunication Applications* (1999) pp. 115–117, 188–193.

Parker et al., "SiGe heterostructure CMOS circuits and applications," *Solid State Electronics*, vol. 43 (1999) pp. 1497–1506.

Ransom et al., "Gate–Self–Aligned n–channel and p–channel Germanium MOSFET's," *IEEE Transactions on Electron Devices*, vol. 38, No. 12 (Dec. 1991) pp. 2695.

Reinking et al., "Fabrication of high–mobility Ge p–channel MOSFETs on Si substrates," *Electronics Letters*, vol. 35, No. 6 (Mar. 18, 1999) pp. 503–504.

Rim et al., "Enhanced Hole Mobilities in Surface–channel Strained–Si p–MOSFETs"; *IEDM*, 1995, pp. 517–520.

Rim et al., "Fabrication and Analysis of Deep Submicron Strained–Si N–MOSFET's"; *IEEE Transactions on Electron Devices*, vol. 47, No. 7 (Jul. 2000) pp. 1406–1415.

Rim, "Application of Silicon–Based Heterostructures to Enhanced Mobility Metal–Oxide–Semiconductor Field–Effect Transistors", Ph.D. Thesis, Stanford University (1999) pp. 1–184.

Robbins et al., "A model for heterogeneous growth of $Si_{1-x}Ge_x$ films for hydrides," *Journal of Applied Physics*, vol. 69, No. 6 (Mar. 15, 1991) pp. 3729–3732.

Schäffler, "High–Mobility Si and Ge Structures," *Semiconductor Science and Technology,* vol. 12 (1997) pp. 1515–1549.

Sugimoto et al., "A 2V, 500 MHz and 3V, 920 MHz Low–Power Current–Mode 0.6 µm CMOS VCO Circuit," *IEICE Trans. Electron.,* vol. E82–C, No. 7 (Jul. 1999) pp. 1327–1329.

Tement et al., "Metal Gate Strained Silicon MOSFET's for Microwave Integrated Circuits", *IEEE* (Oct. 2000) pp. 38–43.

Tweet et al., "Factors determining the composition of strained GeSi layers grown with disilane and germane," *Applied Physics Letters,* vol. 65, No. 20 (Nov. 14, 1994) pp. 2579–2581.

Welser et al., "Electron Mobility Enhancement in Strained–Si N–Type Metal–Oxide–Semiconductor FieldEffect Transistors," *IEEE Electron Device Letters,* vol. 15, No. 3 (Mar. 1994) pp. 100–102.

Welser et al., "Evidence of Real–Space Hot–Electron Transfer in High Mobility, Strained–Si Multilayer MOSFETs," *IEEE IDEM Technical Digest* (1993) pp. 545–548.

Welser et al., "NMOS and PMOS Tranistors Fabricated in Strained Silicon/Relaxed Silicon–Germanium Structures," *IEEE IDEM Technical Digest* (1992) pp. 1000–1002.

Welser, "The Application of Strained Silicon/Relaxed Silicon Germanium Heterostructures to Metal–Oxide–Semiconductor Field–Effect Transistors," Ph.D. Thesis, Stanford University (1994) pp. 1–205.

Wolf et al., "Silicon Processing for the VLSI Era," vol. 1 *Process Technology* (1986) pp. 384–386.

Xie et al., "Semiconductor Surface Roughness: Dependence on Sign and Magnitude of Bulk Strain," *The Physical Review Letters,* vol. 73, No. 22 (Nov. 28, 1994) pp. 3006–3009.

Xie et al., "Very high mobility two–dimensional hole gas in $Si/Ge_xSi_{1-x}/Ge$ structures grown by molecular beam eiptaxy," *Appl. Phys. Lett.,* vol. 63, No. 16 (Oct. 18, 1993) pp. 2263–2264.

Xie, "SiGe Field effect transistors," *Materials Science and Engineering,* vol. 25 (1999) pp. 89–121.

Tsang et al., "Measurements of alloy composition and strain in thin $Ge_x Si_{1-x}$ layers," *J. Appl. Phys.,* vol. 75 No. 12 (Jun. 15, 1994) pp. 8098–8108.

Sakaguchi et al., "ELTRAN® by Splitting Porous Si Layers," *Proc. 195$^{th}$ Int. SOI Symposium,* vol. 99–3, *Electrochemical Society* (1999) pp. 117–121.

Yamagata et al., "Bonding, Splitting and Thinning by Porous Si in ELTRAN®; SOI–Epi Wafer™," *Mat. Res. Soc. Symp. Proc.,* vol. 681E (2001) pp. 18.2.1–18.2.10.

\* cited by examiner

SEMICONDUCTOR SUBSTRATE STRUCTURE

This application is a divisional of application Ser. No. 09/928,126, filed on Aug. 10, 2001 now U.S. Pat. No. 6,573,126, which claims priority from provisional application Ser. No. 60/225,666, filed Aug. 16, 2000, now expired, the entire disclosures of which are incorporated by reference herein.

BACKGROUND OF THE INVENTION

The present invention relates to a production of a general substrate of relaxed $Si_{1-x}Ge_x$-on-insulator (SGOI) for various electronics or optoelectronics applications, and the production of monocrystalline III–V or II–VI material-on-insulator substrate.

Relaxed $Si_{1-x}Ge_x$-on-insulator (SGOI) is a very promising technology as it combines the benefits of two advanced technologies: the conventional SOI technology and the disruptive SiGe technology. The SOI configuration offers various advantages associated with the insulating substrate, namely reduced parasitic capacitances, improved isolation, reduced short-channel-effect, etc. High mobility strained-Si, strained-$Si_{1-x}Ge_x$ or strained-Ge MOS devices can be made on SGOI substrates.

Other III–V optoelectronic devices can also be integrated into the SGOI substrate by matching the lattice constants of III–V materials and the relaxed $Si_{1-x}Ge_x$. For example a GaAs layer can be grown on $Si_{1-x}Ge_x$-on-insulator where x is equal or close to 1. SGOI may serve as an ultimate platform for high speed, low power electronic and optoelectronic applications.

SGOI has been fabricated by several methods in the prior art. In one method, the separation by implantation of oxygen (SIMOX) technology is used to produce SGOI. High dose oxygen implant was used to bury high concentrations of oxygen in a $Si_{1-x}Ge_x$ layer, which was then converted into a buried oxide (BOX) layer upon annealing at high temperature (for example, 1350° C.). See, for example, Mizuno et al. IEEE Electron Device Letters, Vol. 21, No. 5, pp. 230–232, 2000 and Ishilawa et al. Applied Physics Letters, Vol. 75, No. 7, pp. 983–985, 1999. One of the main drawbacks is the quality of the resulting $Si_{1-x}Ge_x$ film and BOX. In addition, Ge segregation during high temperature anneal also limits the maximum Ge composition to a low value.

U.S. Pat. Nos. 5,461,243 and 5,759,898 describe a second method, in which a conventional silicon-on-insulator (SOI) substrate was used as a compliant substrate. In the process, an initially strained $Si_{1-x}Ge_x$ layer was deposited on a thin SOI substrate. Upon an anneal treatment, the strain was transferred to the thin silicon film underneath, resulting in relaxation of the top $Si_{1-x}Ge_x$ film. The final structure is relaxed-SiGe/strained-Si/insulator, which is not an ideal SGOI structure. The silicon layer in the structure is unnecessary, and may complicate or undermine the performance of devices built on it. For example, it may form a parasitic back channel on this strained-Si, or may confine unwanted electrons due to the band gap offset between the strained-Si and SiGe layer.

U.S. Pat. Nos. 5,906,951 and 6,059,895 describe the formation of a similar SGOI structure: strained-layer(s)/relaxed-SiGe/Si/insulator structure. The structure was produced by wafer bonding and etch back process using a $P^{++}$ layer as an etch stop. The presence of the silicon layer in the above structure may be for the purpose of facilitating Si-insulator wafer bonding, but is unnecessary for ideal SGOI substrates. Again, the silicon layer may also complicate or undermine the performance of devices built on it. For example, it may form a parasitic back channel on this strained-Si, or may confine unwanted electrons due to the band gap offset between the strained-Si and SiGe layer. Moreover, the etch stop of $P^{++}$ in the above structure is not practical when the first graded $Si_{1-y}Ge_y$ layer described in the patents has a y value of larger than 0.2. Experiments from research shows $Si_{1-y}Ge_y$ with y larger than 0.2 is a very good etch stop for both KOH and TMAH, as described in a published PCT application WO 99/53539. Therefore, the KOH will not be able to remove the first graded $Si_{1-y}Ge_y$ layer and the second relaxed SiGe layer as described in the patents.

Other attempts include re-crystallization of an amorphous $Si_{1-x}Ge_x$ layer deposited on the top of SOI (silicon-on-insulator) substrate, which is again not an ideal SGOI substrate and the silicon layer is unnecessary, and may complicate or undermine the performance of devices built on it. Note Yeo et al. IEEE Electron Device Letters, Vol. 21, No. 4, pp. 161–163, 2000. The relaxation of the resultant SiGe film and quality of the resulting structure are main concerns.

From the above, there is a need for a simple technique for relaxed SGOI substrate production, a need for a technique for production of high quality SGOI and other III–V material-on-insulator, and a need for a technique for wide range of material transfer.

SUMMARY OF THE INVENTION

According to the invention, there is provided an improved technique for production of wide range of high quality material is provided. In particular, the production of relaxed $Si_{1-x}Ge_x$-on-insulator (SGOI) substrate or relaxed III–V or II–VI material-on-insulator, such as GaAs-on-insulator, is described. High quality monocrystalline relaxed SiGe layer, relaxed Ge layer, or other relaxed III–V material layer is grown on a silicon substrate using a graded $Si_{1-x}Ge_x$ epitaxial growth technique. A thin film of the layer is transferred into an oxidized handle wafer by wafer bonding and wafer splitting using hydrogen ion implantation. The invention makes use of the graded $Si_{1-x}Ge_x$ buffer structure, resulting in a simplified and improved process.

The invention also provides a method allowing a wide range of device materials to be integrated into the inexpensive silicon substrate. For example, it allows production of $Si_{1-x}Ge_x$-on-insulator with wide range of Ge concentration, and allows production of many III–V or II–VI materials on insulator like GaAs, AlAs, ZnSe and InGaP. The use of graded $Si_{1-x}Ge_x$ buffer in the invention allows high quality materials with limited dislocation defects to be produced and transferred. In one example, SGOI is produced using a SiGe structure in which a region in the graded buffer can act as a natural etch stop.

The invention provides a process and method for producing monocrystalline semiconductor layers. In an exemplary embodiment, a graded $Si_{1-x}Ge_x$ (x increases from 0 to y) is deposited on a first silicon substrate, followed by deposition of a relaxed $Si_{1-y}Ge_y$ layer, a thin strained $Si_{1-z}Ge_z$ layer and another relaxed $Si_{1-y}Ge_y$ layer. Hydrogen ions are then introduced into the strained $Si_zGe_z$ layer. The relaxed $Si_{1-y}Ge_y$ layer is bonded to a second oxidized substrate. An annealing treatment splits the bonded pair at the strained Si layer, whereby the second relaxed $Si_{1-y}Ge_y$ layer remains on said second substrate.

In another exemplary embodiment, a graded $Si_{1-x}Ge_x$ is deposited on a first silicon substrate, where the Ge concentration x is increased from 0 to 1. Then a relaxed GaAs layer is deposited on the relaxed Ge buffer. As the lattice constant of GaAs is close to that of Ge, GaAs has high quality with limited dislocation defects. Hydrogen ions are introduced into the relaxed GaAs layer at the selected depth. The relaxed GaAs layer is bonded to a second oxidized substrate. An annealing treatment splits the bonded pair at the hydrogen ion rich layer, whereby the upper portion of relaxed GaAs layer remains on said second substrate.

DETAILED DESCRIPTION OF THE INVENTION

Figure 1A:
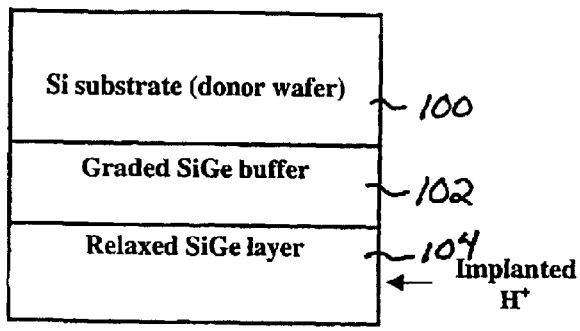
FIGS. 1A–1C are block diagrams showing the process of producing a SGOI substrate in accordance with the invention.

An example of a process in which SGOI is created by layer transfer is described. The experiment was performed in two stages. In the first stage, heteroepitaxial SiGe layers are formed by a graded epitaxial growth technology. Starting with a 4-inch Si (100) donor wafer 100, a linearly stepwise compositionally graded $Si_{1-x}Ge_x$ buffer 102 is deposited with CVD, by increasing Ge concentration from zero to 25%. Then a 2.5 µm relaxed $Si_{0.75}Ge_{0.25}$ cap layer 104 is deposited with the final Ge composition, as shown in FIG. 1A.

Figure 1B:
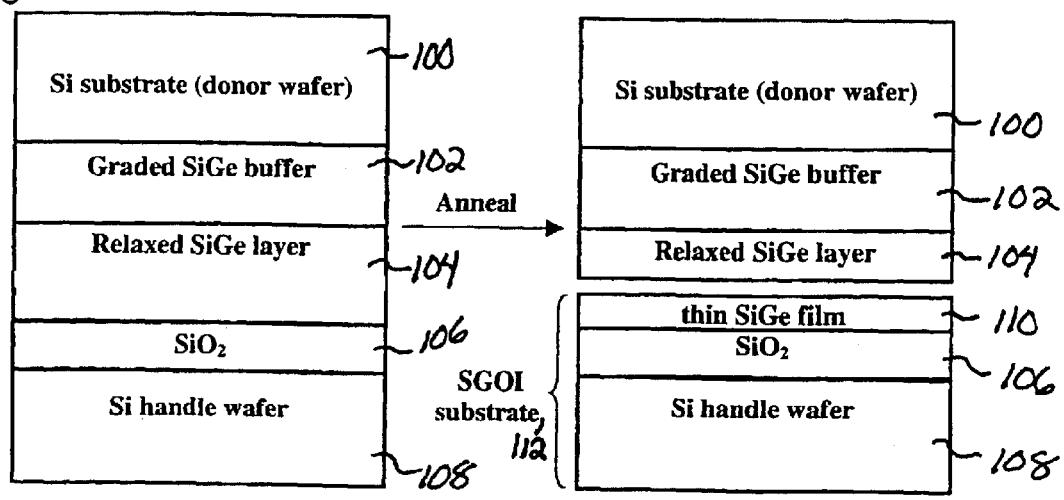

The relaxed SiGe cap layer has high quality with very low dislocation defect density (less than $1E6/cm^2$), as the graded buffer accommodates the lattice mismatch between Si and relaxed SiGe. A thin layer of this high quality SiGe will be transferred into the final SGOI structure. The surface of the as-grown relaxed SiGe layer shows a high roughness around 11 nm to 15 nm due to the underlying strain fields generated by misfit dislocations at the graded layer interfaces and thus chemical-mechanical polishing (CMP) is used to smooth the surface. In the second stage, the donor wafer is implanted with hydrogen ion (100 keV, $5E16\ H^+/cm^2$) to form a buried hydrogen-rich layer. After a surface clean step in a modified RCA solution, it is bonded to an oxidized 106 Si handle wafer 108 at room temperature as shown in FIG. 1B.

The wafer bonding is one of the key steps, and the bonding energy should be strong enough in order to sustain the subsequent layer transfer in the next step. Good bonding requires a flat surface and a highly hydrophilic surface before bonding. On the other hand, the buried oxide in the final bonded structure is also required to have good electrical properties as it will influence the final device fabricated on it. In the conventional Si film transfer, thermal oxide on the donor wafer is commonly used before $H^+$ implantation and wafer bonding, which becomes the buried oxide in the resulting silicon-on-insulator structure.

The thermal oxide of the Si donor wafer meets all the requirements, as it has good electrical properties, has flat surface and bonds very well to the handle wafer. Unlike the Si, however, the oxidation of SiGe film results in poor thermal oxide quality, and the Ge segregation during oxidation also degrades the SiGe film. Therefore the thermal oxide of SiGe is not suitable for the SGOI fabrication. In one exemplary experiment the SiGe film will be directly bonded to an oxidized Si handle wafer. The high quality thermal oxide in the handle wafer will become the buried oxide in the final SGOI structure.

Having a flat surface after a CMP step, the SiGe wafer went through a clean step. Compared to Si, one difficulty of SiGe film is that, SiGe surface becomes rougher during the standard RCA clean, as the $NH_4OH$ in RCA1 solution etches Ge faster than Si. Rough surface will lead to weak bonding as the contact area is reduced when bonded to the handle wafer. In this exemplary embodiment, $H_2SO_4$—$H_2O_2$ solution is used in the place of RCA1, which also meets the clean process requirement for the subsequent furnace annealing after bonding. The SiGe surface after $H_2SO_4$—$H_2O_2$ clean shows better surface roughness compared to RCA1.

Figure 1C:
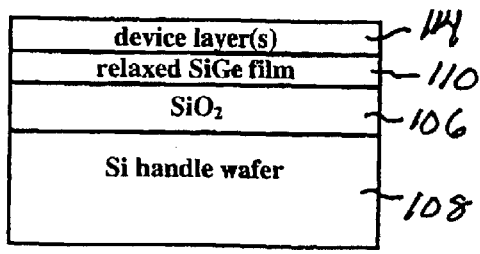

After this modified clean procedure, the SiGe wafer is dipped in the diluted HF solution to remove the old native oxide. It is then rinsed in DI water thoroughly to make the surface hydrophilic by forming a fresh new native oxide layer that is highly active. After spinning dry, the SiGe wafer is bonded to an oxidized handle wafer at room temperature, and then annealed at 600° C. for 3 hours. During anneal the bonded pair split into two sheets along the buried hydrogen-rich layer, and a thin relaxed $Si_{0.75}Ge_{0.25}$ film 110 is transferred into the handle wafer, resulting in a SGOI substrate 112, as shown in FIG. 1B. A final 850° C. anneal improves the $Si_{0.75}Ge_{0.25}/SiO_2$ bond. Thereafter, device layers 114 can be processed on the SGOI substrate 112 as shown in FIG. 1C.

Figures 2A, 2B:
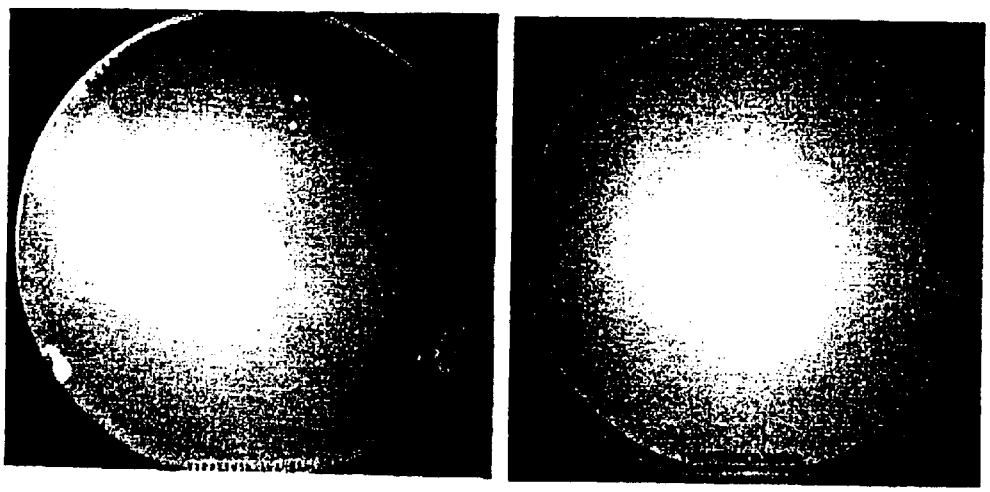
FIGS. 2A and 2B are infrared transmission images of an as-bonded wafer pair and a final SGOI substrate after splitting, respectively.
Figure 3:
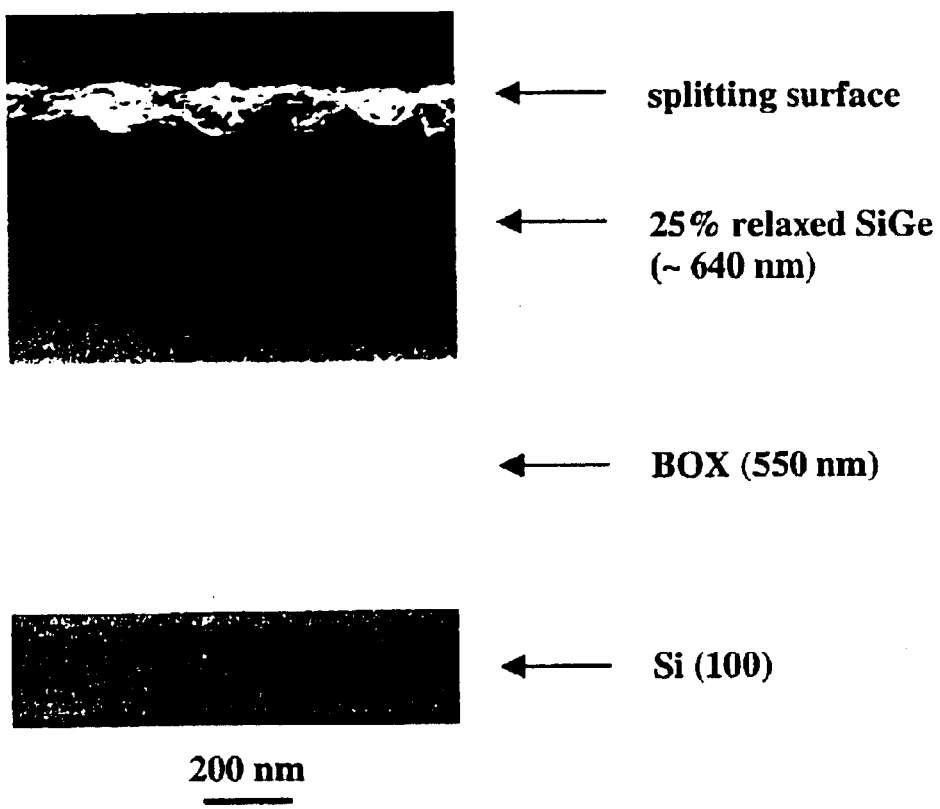
FIG. 3 is a TEM cross-section view of a SiGe layer that was transferred onto the top of a buried oxide.

FIGS. 2A and 2B are infrared transmission images of the as-bonded wafer pair and the final SGOI substrate after splitting, respectively. To investigate the surface of the as-transferred SGOI substrate, transmission electron microscopy (TEM) and atomic force microscopy (AFM) were used. The TEM cross-section view in FIG. 3 shows a ~640 nm SiGe layer was transferred onto the top of a 550 nm buried oxide (BOX). Surface damage is also shown clearly at the splitting surface with a damage depth of ~100 nm.

Figure 4:
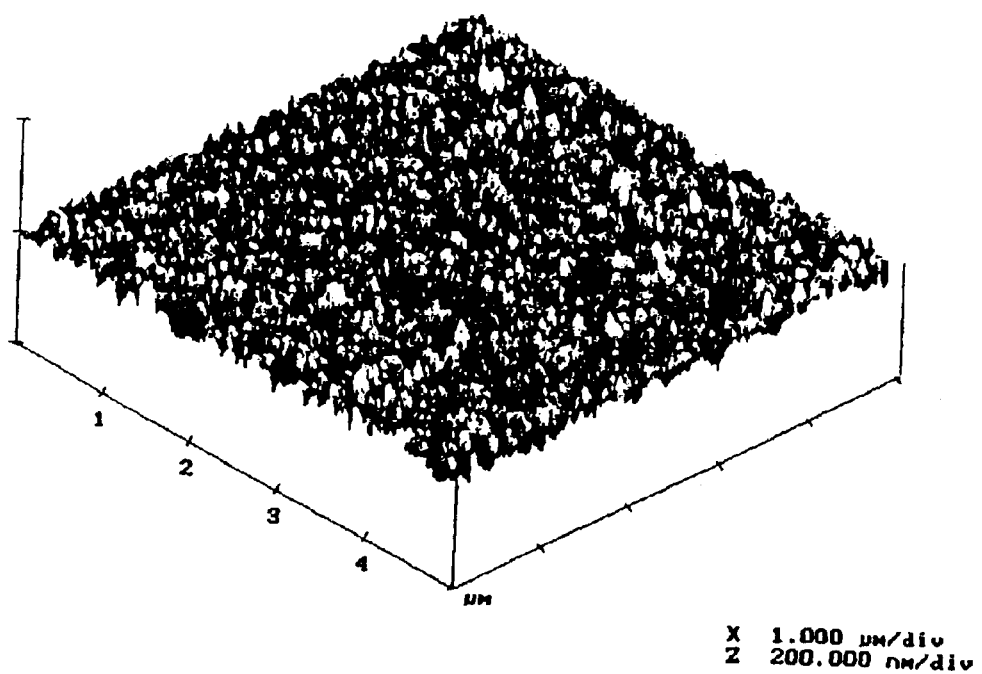
FIG. 4 is an AFM for a transferred SGOI substrate showing surface roughness.

FIG. 4 shows a surface roughness of 11.3 nm in an area of 5×5 $\mu m^2$ by AFM for the as-transferred SGOI. The data is similar to those from as-transferred silicon film by smart-cut process, and suggests that a top layer of about 100 nm should be removed by a final CMP step. After SiGe film transferring, only a thin relaxed SiGe film is removed and the donor wafer can be used again for a donor wafer. Starting from this general SGOI substrate, various device structures can be realized by growing one or more device layers on the top, as shown in FIG. 2C. Electrical evaluation is in progress by growing a strain Si layer on the top of this SGOI substrate followed by fabrication of strained Si channel devices.

Bond strength is important to the process of the invention. AFM measurements were conducted to investigate the SiGe film surface roughness before bonding under different conditions. One experiment is designed to investigate how long the SiGe surface should be polished to have smooth surface and good bond strength, since the surface of the as-grown relaxed SiGe layer has a high roughness around 11 nm to 15 nm. Several identical 4-inch Si wafers with relaxed $Si_{0.75}Ge_{0.25}$ films were CMPed with optimized polishing conditions for different times. Using AFM, the measured surface mircoroughness RMS at an area of 10 µm×10 µm is 5.5 Å, 4.5 Å and 3.8 Å, for wafer CMPed for 2 min., 4 min. and 6 min. respectively. After bonding to identical handle wafers, the tested bond strength increases with decreasing RMS. A CMP time of 6 min. is necessary for good strength.

In another experiment, two identical 4-inch Si wafers with relaxed $Si_{0.75}Ge_{0.25}$ films were CMPed for 8 min. After two cleaning steps in $H_2SO_4:H_2O_2$ solution and one step in diluted HF solution, one wafer was put in a new $H_2SO_4:H_2O_2$ (3:1) solution and another in a new $NH_4OH:H_2O_2:H_2O$ (1:1:5), i.e. the conventional RCA1 solution, both for 15 min. The resultant wafers were tested using AFM. The wafer after $H_2SO_4:H_2O_2$ solution shows a surface roughness RMS of 2 Å at an area of 1 $\mu m \times 1$ $\mu m$, which after $NH_4OH:H_2O_2:H_2O$ shows 4.4 Å. Clearly, the conventional RCA clean roughens the SiGe surface significantly, and $H_2SO_4:H_2O_2$ should be used for SiGe clean.

In yet another experiment, the clean procedure is optimized before bonding. For direct SiGe wafer to oxidized handle wafer bonding (SiGe-oxide bonding), several different clean procedures were tested. It has been found that the $H_2SO_4:H_2O_2$ (2~4:1) solution followed by DI water rinse and spin dry gives good bond strength. Alternatively, one can also deposit an oxide layer on the SiGe wafer and then CMP the oxide layer. In this case SiGe/oxide is bonded to an oxidized handle wafer, i.e. oxide-oxide bonding. Among different clean procedures, it was found that $NH_4OH:H_2O_2:H_2O$ clean and DI water rinse following by diluted HF, DI water rinse and spin dry gives very good bond strength.

Figure 5:
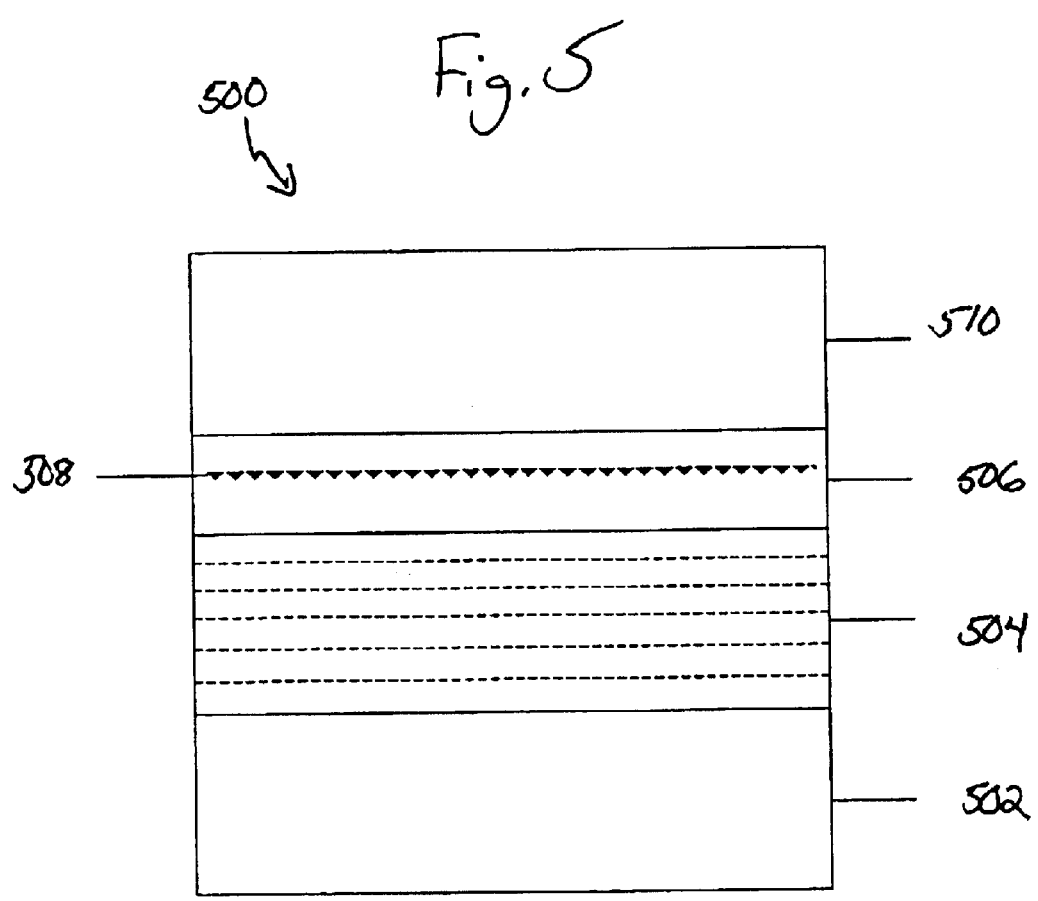
FIGS. 5–8 are block diagrams of various exemplary embodiments semiconductor structures in accordance with the invention.

FIG. 5 is a block diagram of an exemplary embodiment of a semiconductor structure 500 in accordance with the invention. A graded $Si_{1-x}Ge_x$ buffer layer 504 is grown on a silicon substrate 502, where the Ge concentration x is increased from zero to a value y in a stepwise manner, and y has a selected value between 0 and 1. A second relaxed $Si_{1-y}Ge_y$ layer 506 is then deposited, and hydrogen ions are implanted into this layer with a selected depth by adjusting implantation energy, forming a buried hydrogen-rich layer 508. The wafer is cleaned and bonded to an oxidized handle wafer 510. An anneal treatment at 500~600° C. splits the bonded pair at the hydrogen-rich layer 508. As a result, the upper portion of the relaxed $Si_{1-y}Ge_y$ layer 506 remains on the oxidized handle wafer, forming a SGOI substrate. The above description also includes production of Ge-on-insulator where y=1.

During the wafer clean step prior to bonding, the standard RCA clean for the silicon surface is modified. Since the $NH_4OH$ in standard RCA1 solution etches Ge faster than Si, the SiGe surface will become rough, leading to a weak bond. A $H_2SO_4$—$H_2O_2$ solution is used in the place of RCA1, which also meets the clean process requirement for the subsequent furnace annealing after bonding. The SiGe surface after the $H_2SO_4$—$H_2O_2$ clean showed better surface roughness compared to RCA1. After the modified RCA clean, the wafers are then immersed in another fresh $H_2SO_4$—$H_2O_2$ solution for 10 to 20 min. $H_2SO_4$—$H_2O_2$ renders the SiGe surface hydrophilic. After a rinse in DI wafer and spin drying, the SiGe wafer is bonded to an oxidized handle wafer at room temperature immediately, and then annealed at 500~600° C. for wafer splitting.

Figure 6:
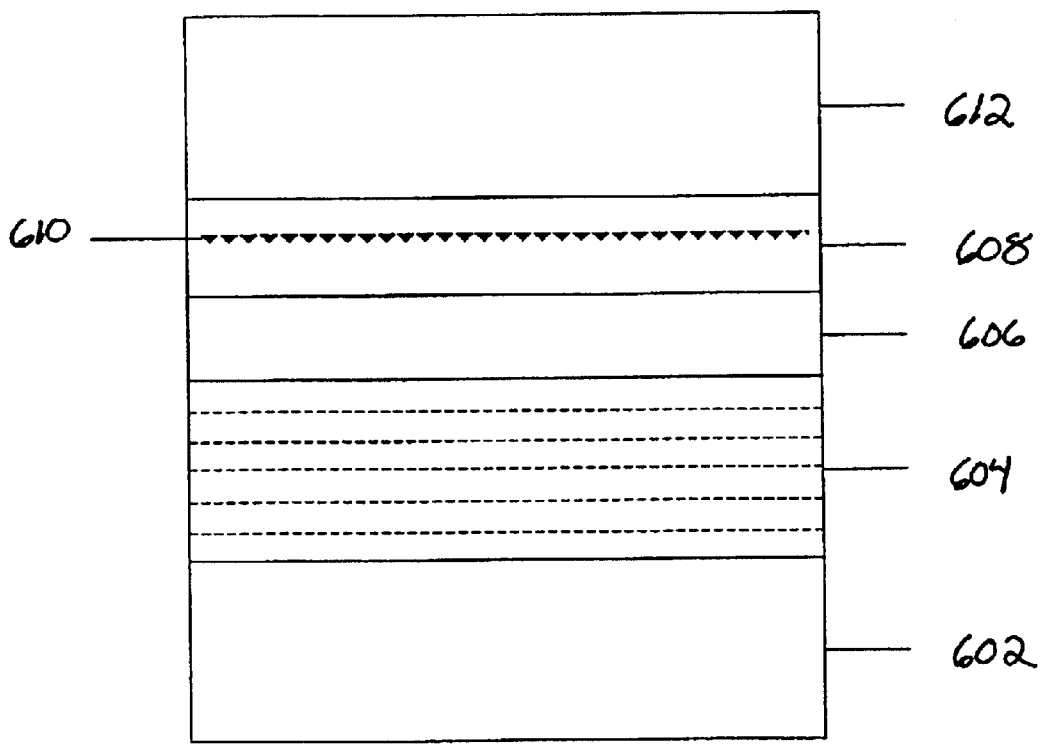

FIG. 6 is a block diagram of another exemplary embodiment of a semiconductor structure 600. The structure 600 includes a graded $Si_{1-x}Ge_x$ buffer layer 604 grown on a silicon substrate 602, where the Ge concentration x is increased from zero to 1. Then a relaxed pure Ge layer 606 and a III–V material layer 608, such as a GaAs layer, are epitaxially grown on the Ge layer. Hydrogen ions are implanted into the GaAs layer 608 with a selected depth by adjusting implantation energy, forming a buried hydrogen-rich layer 610. The wafer is cleaned and bonded to an oxidized handle wafer 612. An anneal treatment splits the bonded pair at the hydrogen-rich layer 610. As a result, the upper portion of the GaAs layer 608 remains on the oxidized handle wafer, forming a GaAs-on-insulator substrate.

Figure 7:
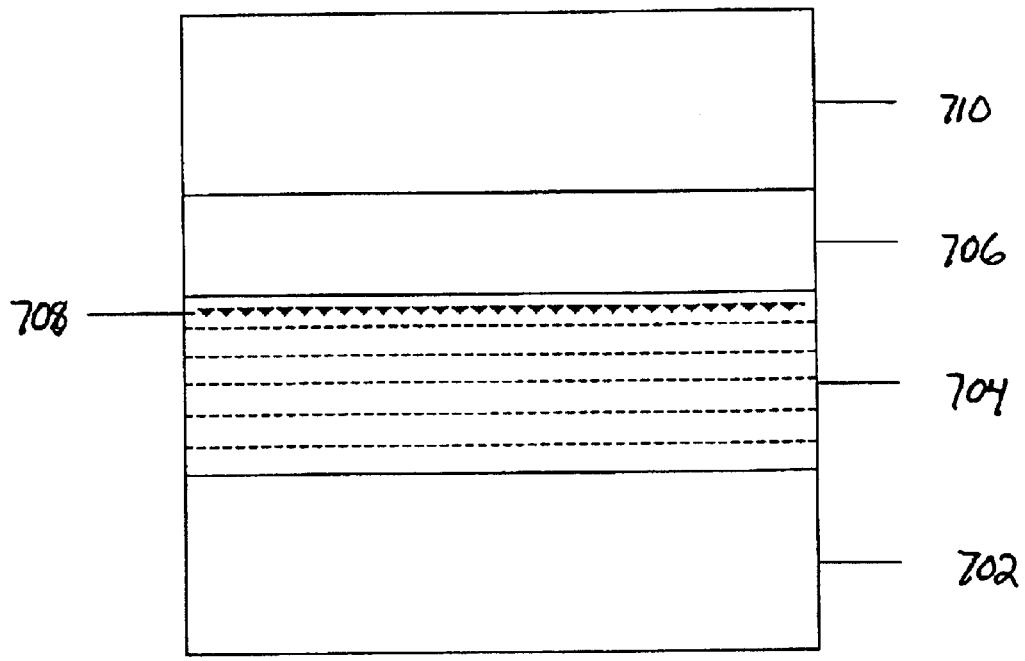

FIG. 7. is a block diagram of yet another exemplary embodiment of a semiconductor structure 700. A graded $Si_{1-x}Ge_x$ buffer layer 704 is grown on a silicon substrate 702, where the Ge concentration x is increased from zero to a selected value y, where y is less than 0.2. A second relaxed $Si_{1-z}Ge_z$ layer 706 is deposited, where z is between 0.2 to 0.25. Hydrogen ions are implanted into the graded $Si_{1-x}Ge_x$ buffer layer 704 with a selected depth, forming a buried hydrogen-rich layer 708 within layer 704. The wafer is cleaned and bonded to an oxidized handle wafer 710. An anneal treatment at 500~600° C. splits the bonded pair at the hydrogen-rich layer 708.

As a result, the upper portion of the graded $Si_{1-x}Ge_x$ buffer layer 704 and the relaxed $Si_{1-z}Ge_z$ layer 706 remains on the oxidized handle wafer 710. The remaining graded $Si_{1-x}Ge_x$ buffer layer 704 is then selectively etched by either KOH or TMAH. KOH and TMAH etch $Si_{1-x}Ge_x$ fast when x is less 0.2, but becomes very slow when x is larger than 0.2. Thus, the graded $Si_{1-x}Ge_x$ buffer layer 704 can be etched selectively, leaving the relaxed $Si_{1-z}Ge_z$ layer 706 on the insulating substrate 710 and forming a relaxed SGOI substrate. In this process, the thickness of the relaxed $Si_{1-z}Ge_z$ film 706 on the final SGOI structure is defined by film growth, which is desired in some applications.

Figure 8:
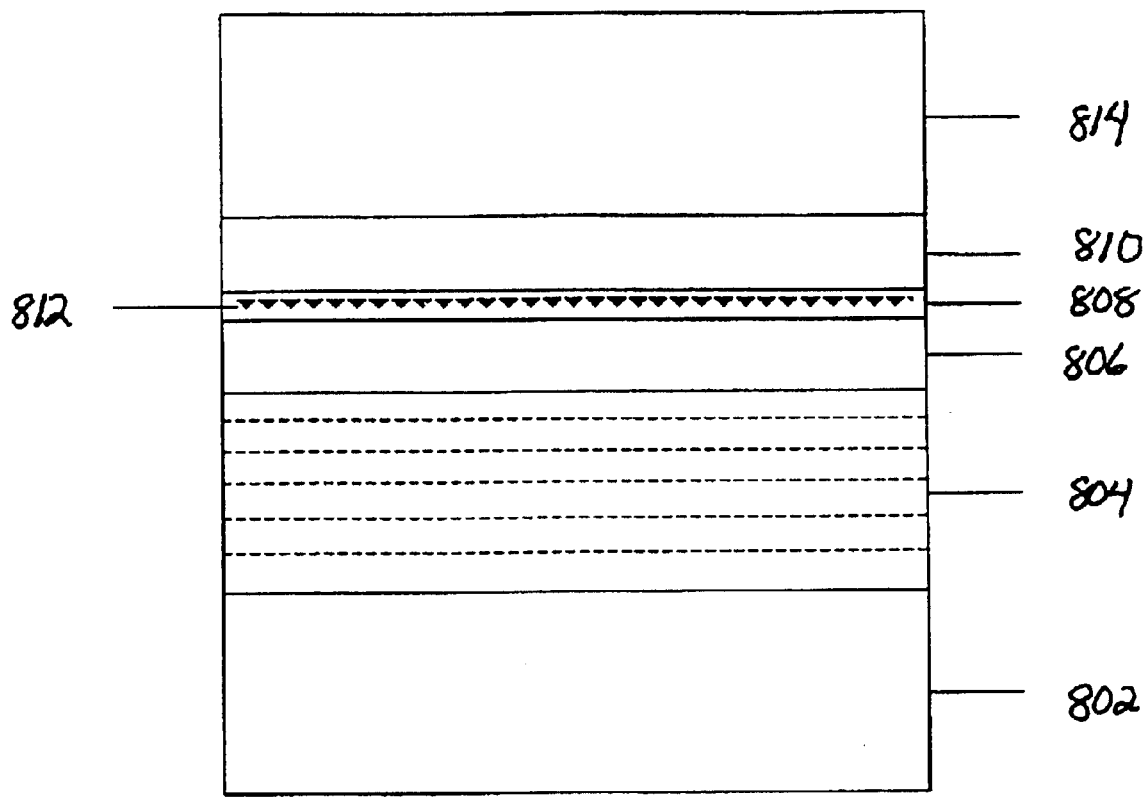

FIG. 8 is a block diagram of yet another exemplary embodiment of a semiconductor structure 800. A graded $Si_{1-x}Ge_x$ buffer layer 804 is grown on a silicon substrate 802, where the Ge concentration x is increased from zero to a selected value y between 0 and 1. A second relaxed $Si_{1-y}Ge_y$ layer 806 is deposited, followed by a strained $Si_{1-z}Ge_z$ layer 808 and another relaxed $Si_{1-y}Ge_y$ layer 810. The thickness of layers 806, 808, and 810, and the value z are chosen such that the $Si_{1-z}Ge_z$ layer 808 is under equilibrium strain state while the $Si_{1-y}Ge_y$ layers 806 and 810 remain relaxed. In one option, hydrogen ions may be introduced into the strained $Si_{1-z}Ge_z$ layer 808, forming a hydrogen-rich layer 812. The wafer is cleaned and bonded to an oxidized handle wafer 814. The bonded pair is then separated along the strained $Si_{1-z}Ge_z$ layer 808.

Since the strain makes the layer weaker, the crack propagates along this layer during separation. The separation can be accomplished by a variety of techniques, for example using a mechanical force or an anneal treatment at 500~600° C. when the hydrogen is also introduced. See, for example, U.S. Pat. Nos. 6,033,974 and 6,184,111, both of which are incorporated herein by reference. As a result, the relaxed $Si_{1-y}Ge_y$ layer 810 remains on the oxidized handle wafer, forming a relaxed SGOI substrate. The thickness of layers 806, 808, and 810, and the value z may also be chosen such that there are a good amount of dislocations present in the $Si_{1-z}Ge_z$ layer 808 while the top $Si_{1-y}Ge_y$ layer 810 remains relaxed and having high quality and limited dislocation defects.

These dislocation defects in the $Si_{1-z}Ge_z$ layer 808 can then act as hydrogen trap centers during the subsequent step of introducing ions. The hydrogen ions may be introduced by various ways, such as ion implantation or ion diffusion or drift by means of electrolytic charging. The value of z may be chosen in such a way that the remaining $Si_{1-z}Ge_z$ layer 808 can be etched selectively by KOH or TMAH. The layers 806 and 810 may also be some other materials, for example pure Ge, or some III–V materials, under the condition that the Ge concentration x in the graded $Si_{1-x}Ge_x$ buffer layer 804 is increased from zero to 1.

After all the semiconductor-on-insulator substrate obtained by the approaches described above, various device layers can be further grown on the top. Before the regrowth, CMP maybe used to polish the surface.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
   a substrate including an insulator layer;
   a first layer of relaxed $Si_{1-x}Ge_x$ disposed over the insulator layer, wherein x has a value in the range of 0.1 to 1; and
   a second layer disposed over the substrate, the second layer comprising a material selected from the group consisting of GaAs, AlAs, ZnSe, InGaP, and strained $Si_{1-y}Ge_y$ wherein y has a value different from the value of x.

2. A semiconductor structure comprising:
   a substrate; and
   a plurality of layers disposed over the substrate, the layers comprising:
      a graded $Si_{1-x}Ge_x$ buffer layer, the graded buffer layer having a Ge concentration x, wherein x has a value that increases from zero to a value y;
      a first relaxed, layer comprising $Si_{1-y}Ge_y$; and
      a separation layer comprising at least one material selected from the group consisting of strained $Si_{1-z}Ge_z$ with z≠y, III–V materials, and II–VI materials.

3. The structure of claim 1 wherein the value of x is in the range of 0.3 to 1.

4. A semiconductor structure comprising:
   a substrate;
   a first layer of relaxed $Si_{1-x}Ge_x$ disposed over the substrate, x having a value in the range of 0.1 to 1;
   a second layer disposed over the substrate, the second layer comprising at least one material selected from the group consisting of GaAs, AlAs, ZnSe, InGaP, and strained $Si_{1-y}Ge_y$ wherein y has a value different from the value of x; and
   a plurality of ions disposed in at least one of the first layer and the second layer.

5. The structure of claim 4 wherein the ions comprise at least one of hydrogen $H^+$ ions and $H_2^+$ ions.

6. The structure of claim 2 wherein a surface of the structure has a root mean square surface roughness of less than about 11 angstroms.

7. The structure of claim 2, further comprising:
   a second relaxed layer.

8. The structure of claim 7 wherein the second relaxed layer comprises relaxed $Si_{1-w}Ge_w$ and w is substantially equal to y.

9. The structure of claim 7 wherein y is approximately equal to 1 and the second relaxed layer comprises at least one material selected from the group consisting of Ge, GaAs, AlAs, ZnSe, and InGaP.

10. The structure of claim 2, further comprising:
    a plurality of ions disposed in the structure.

11. The structure of claim 10 wherein the ions comprise at least on of hydrogen $H^+$ ions and $H_2^+$ ions.

12. The structure of claim 10 wherein the ions are disposed in the separation layer.

13. The structure of claim 10 wherein the separation layer comprises a strained layer and the ions are disposed in one of the graded buffer layer and the first relaxed layer.

14. The structure of claim 2, further comprising:
    an oxide layer disposed over the plurality of layers.

15. The structure of claim 2, further comprising:
    a device integrated into at least a portion of the plurality of layers.

16. The semiconductor structure of claim 2 wherein the separation layer comprises a strained layer.

17. The semiconductor structure of claim 2 wherein the separation layer comprises a defect layer.

18. A semiconductor structure comprising:
    a substrate comprising silicon;
    an insulating layer disposed over the substrate; and
    a relaxed $Si_{1-x}Ge_x$ layer disposed over the insulating layer, the relaxed $Si_{1-x}Ge_x$ layer having a uniform composition and a dislocation defect density of less than $10^6/cm^2$.

19. The structure of claim 18 wherein a Ge concentration x of the relaxed layer is in the range of zero to 1.

20. The structure of claim 19 wherein the Ge concentration x is in the range of 0.3 to 1.

21. The structure of claim 18, further comprising:
    a device layer disposed over the relaxed $Si_{1-x}Ge_x$ layer.

22. The structure of claim 18 wherein the device layer comprises at least one material selected from the group consisting of strained Si, strained $Si_{1-y}Ge_y$ with y≠x, III–V materials, and II–VI materials.

23. The structure of claim 18, further comprising:
    a device disposed within at least a portion of the relaxed $Si_{1-x}Ge_x$ layer.

24. A semiconductor structure comprising:
    a relaxed $Si_{1-y}Ge_y$ layer disposed on a substrate; and
    a buried layer defined by implanted ions disposed in the relaxed $Si_{1-y}Ge_y$ layer.

25. A semiconductor structure comprising:
    a first heterostructure including:
       a graded $Si_{1-x}Ge_x$ buffer layer disposed on a first substrate, the graded $Si_{1-x}Ge_x$ buffer layer having a Ge concentration x increasing from zero to a value y;
       a relaxed $Si_{1-y}Ge_y$ layer disposed on the graded $Si_{1-x}Ge_x$ buffer layer; and
       a buried layer defined by implanted ions disposed in one of said graded $Si_{1-x}Ge_x$ buffer layer and relaxed $Si_{1-y}Ge_y$ layer.

26. The semiconductor structure of claim 25 wherein the implanted ions comprise at least one of $H^+$ ions and $H_2^+$ ions.

27. The semiconductor structure of claim 25 wherein a surface of the structure has a roughness less than about 11 nanometers.

28. The semiconductor structure of claim 25, further comprising:
    an oxide layer disposed over the first heterostructure.

29. The semiconductor structure of claim 25 wherein the first heterostructure is bonded to a second substrate, defining a second heterostructure.

30. The semiconductor structure of claim 29 wherein the second substrate comprises an insulator layer and the first heterostructure is bonded to the insulator layer.

31. The semiconductor structure of claim 30 wherein the insulator layer comprises an oxide layer.

32. A semiconductor structure comprising:
   a substrate; and
   a semiconductor layer bonded to the substrate, the semiconductor layer having a surface roughness of less than about 11.3 nanometers.

33. The semiconductor structure of claim 32 wherein the semiconductor layer comprises at least one of relaxed $Si_{1-y}Ge_y$, GaAs, AlAs, ZnSe, and InGaP.

34. The semiconductor structure of claim 33 wherein the semiconductor layer comprises a surface damage layer.

35. The semiconductor structure of claim 33 wherein the surface damage layer has a thickness of less than about 100 nanometers.

36. The semiconductor structure of claim 32, further comprising:
   a device disposed within at least a portion of the semiconductor layer.

37. A semiconductor structure comprising:
   a first heterostructure including:
      a graded $Si_{1-x}Ge_x$ buffer layer disposed on a first substrate, the graded $Si_{1-x}Ge_x$ buffer layer having a Ge concentration x increasing from zero to 1;
      a relaxed Ge layer disposed on the graded $Si_{1-x}Ge_x$ buffer layer;
      a semiconductor layer disposed on the relaxed Ge layer; and
      a buried layer disposed within at least one of the graded $Si_{1-x}Ge_x$ buffer layer, the semiconductor layer, and the relaxed Ge layer, the buried layer being defined by ions.

38. The semiconductor structure of claim 37 wherein the implanted ions comprise at least one of $H^+$ ions and $H_2^+$ ions.

39. The structure of claim 37 wherein the first heterostructure is bonded to a second substrate, thereby defining a second heterostructure.

40. The semiconductor structure of claim 39 further comprising:
   a device disposed within at least a portion of the semiconductor layer.

41. A semiconductor structure comprising:
   a first heterostructure including:
      a graded $Si_{1-x}Ge_x$ buffer layer disposed on a first substrate, the graded $Si_{1-x}Ge_x$ buffer layer having a Ge concentration x increasing from zero to a value y;
      a relaxed $Si_{1-z}Ge_z$ layer disposed on the graded $Si_{1-x}Ge_x$ buffer layer, z being greater than y; and
      a buried layer defined by ions disposed within the graded $Si_{1-x}Ge_x$ buffer layer.

42. The semiconductor structure of claim 41 wherein the implanted ions comprise at least one of $H^+$ ions and $H_2^+$ ions.

43. The semiconductor structure of claim 41 wherein the first heterostructure is bonded to a second substrate, defining a second heterostructure.

44. The semiconductor structure of claim 41, further comprising:
   a device disposed within at least a portion of the semiconductor layer.

45. A semiconductor structure comprising:
   a substrate; and
   a relaxed $Si_{1-z}Ge_z$ layer bonded to the substrate,
   wherein a surface of the $Si_{1-z}Ge_z$ layer is defined by a selective etch.

46. A semiconductor structure comprising:
   a first heterostructure including:
      a graded $Si_{1-x}Ge_x$ buffer layer disposed on a first substrate, wherein the graded $Si_{1-x}Ge_x$ buffer layer has a Ge concentration x increasing from zero to a value y;
      a relaxed $Si_{1-y}Ge_y$ layer disposed on the graded $Si_{1-x}Ge_x$ buffer layer;
      a separation layer disposed on the relaxed $Si_{1-y\ Gey}$ layer;
      a second relaxed layer disposed over the separation layer; and
      a plurality of ions disposed in at least one of the graded buffer layer, the relaxed layer, the separation layer, and the second relaxed layer.

47. The semiconductor structure of claim 46 wherein the implanted ions comprise at least one of $H^+$ ions and $H_2^+$ ions.

48. The semiconductor structure of claim 46 wherein the first heterostructure is bonded to a second substrate, defining a second heterostructure.

49. The semiconductor structure of claim 48 further comprising:
   a device disposed within at least a portion of the second heterostructure.

50. A semiconductor structure comprising:
   a first heterostructure including:
      a layer structure comprising:
         a graded $Si_{1-x}Ge_x$ buffer layer disposed on a first substrate, wherein the Ge concentration x increases from zero to a value y, and
         a relaxed $Si_{1-z}Ge_z$ layer disposed over the graded $Si_{1-x}Ge_x$ buffer layer, wherein z is substantially equal to or greater than y; and
      a buried layer disposed in the layer structure.

51. The structure of claim 50 wherein the buried layer comprises implanted ions.

52. The structure of claim 50 wherein the implanted ions comprise at least one of hydrogen $H^+$ ions and $H_2^+$ ions.

53. The structure of claim 50, wherein the first heterostructure is bonded to a second substrate to define a second heterostructure.

* * * * *

UNITED STATES PATENT AND TRADEMARK OFFICE
CERTIFICATE OF CORRECTION

| | | |
|---|---|---|
| PATENT NO. | : 6,737,670 B2 | Page 1 of 1 |
| APPLICATION NO. | : 10/384160 | |
| DATED | : May 18, 2004 | |
| INVENTOR(S) | : Cheng et al. | |

It is certified that error appears in the above-identified patent and that said Letters Patent is hereby corrected as shown below:

Column 1, between lines 9, ending "herein.", and line 10, beginning "BACKGROUND", insert the following paragraph:

--GOVERNMENT LICENSE RIGHTS

This invention was made with government support under Contract Number N66001-00-1-8954, awarded by the Navy. The government has certain rights in the invention.--

Signed and Sealed this

Twenty-second Day of May, 2007

JON W. DUDAS
*Director of the United States Patent and Trademark Office*